United States Patent [19]
Sathe et al.

[11] Patent Number: 6,107,170
[45] Date of Patent: Aug. 22, 2000

[54] SILICON SENSOR CONTACT WITH PLATINUM SILICIDE, TITANIUM/ TUNGSTEN AND GOLD

[75] Inventors: Abhijeet Sathe; Henry V. Allen, both of Fremont, Calif.

[73] Assignee: SMI Corporation, Fremont, Calif.

[21] Appl. No.: 09/129,195

[22] Filed: Jul. 24, 1998

[51] Int. Cl.[7] ...................................................... H01L 21/44
[52] U.S. Cl. .......................... 438/583; 438/582; 438/611; 438/648; 438/656; 257/751; 257/754
[58] Field of Search ...................................... 438/583, 611, 438/648, 656, 53, 739, 309, 324, 326, 329, 330, 582; 257/751, 754

[56] References Cited

U.S. PATENT DOCUMENTS

| | | | |
|---|---|---|---|
| 4,499,557 | 2/1985 | Holmberg et al. | 365/163 |
| 5,683,594 | 11/1997 | Hocker et al. | 216/33 |
| 5,869,381 | 2/1999 | Herbert et al. | 438/330 |

*Primary Examiner*—David Nelms
*Assistant Examiner*—Reneé R. Berry
*Attorney, Agent, or Firm*—Townsend and Townsend and Crew LLP

[57] ABSTRACT

An improved method for forming a metal contact for a silicon sensor. First, platinum is deposited over a contact area. Then the platinum is sintered to form platinum silicide. Subsequently, titanium/tungsten (TiW) is deposited over the platinum silicide. Finally, gold is deposited over the TiW.

7 Claims, 2 Drawing Sheets

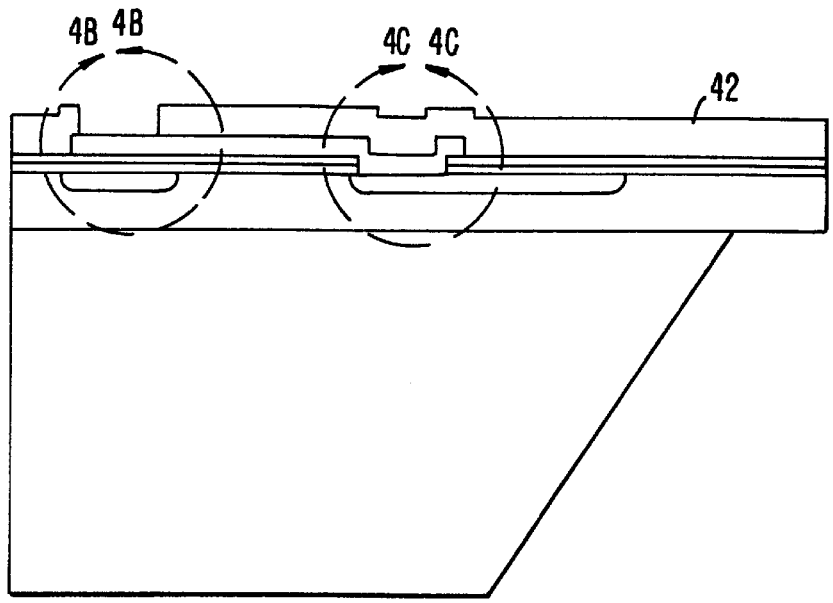
FIG. 4A.
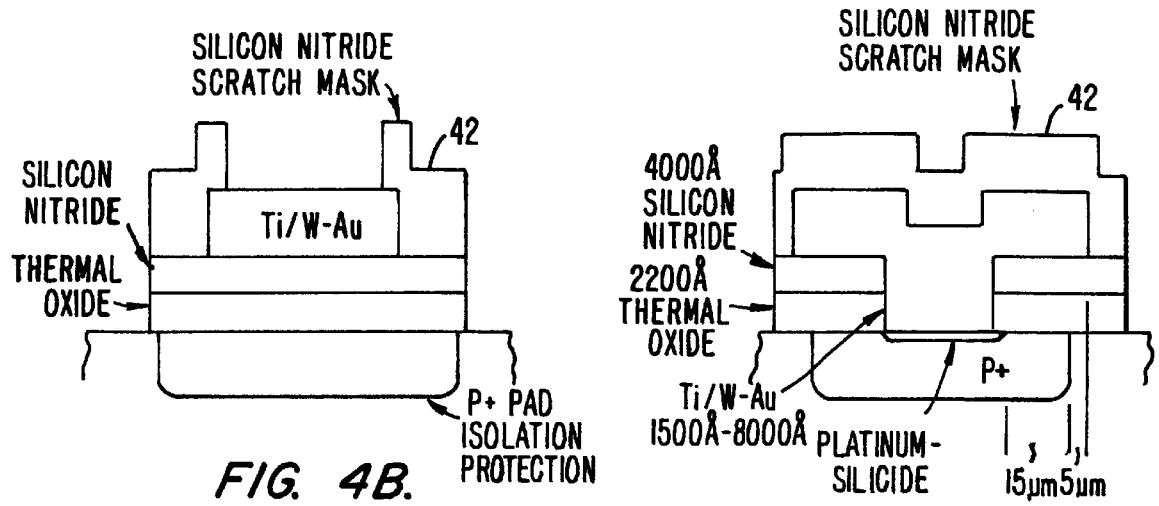
FIG. 4B.
FIG. 4C.
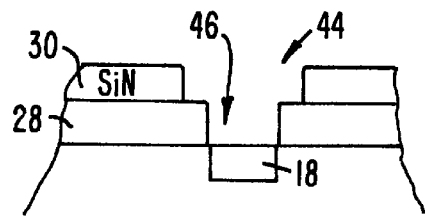
FIG. 5.

SILICON SENSOR CONTACT WITH PLATINUM SILICIDE, TITANIUM/TUNGSTEN AND GOLD

BACKGROUND OF THE INVENTION

The present invention relates to a method of making a silicon pressure sensor that will withstand hostile environments that normally attack standard IC metalization.

A typical silicon pressure sensor has a silicon diaphragm onto which piezo resistive regions are placed to sense movement in the diaphragm. Metalization needs to connect to the resistors so they can be connected to a monitoring circuit. Pressure sensors are often used in corrosive applications, and thus the metalization is typically exposed to the gas or liquid whose pressure is being measured.

One of the challenges in silicon pressure sensor technology is to develop a metalization that is resistant to corrosion. Most applications of pressure sensors require, ultimately, the exposure of the top surface of the sensor to liquids and gases that may tend to corrode metal. The metal of choice for most ICs and Sensors has usually been aluminum or an aluminum composite (Al/Al+1% Si/Al+1% Cu). FIG. 1 illustrates the cross-section of this standard approach.

Exposure to even mild acids rapidly devolves this metalization. To overcome this, a number of approaches have been attempted. These include simply overcoating the aluminum with a noble metal such as gold or gold with an adhesion layer where the aluminum would normally be exposed to the hostile environment. Other approaches have included using Chrome/Gold or Titanium/tungsten/Gold (TiW/Au) directly on silicon contacts. An example of this cross-section is depicted in FIG. 2.

The Chrome—Gold approach has major drawbacks in that there is a tendency to have gold migrate through the chrome, resulting in "purple-plague" and ultimately a degraded performance. Without a good inter-layer, TiW does not always form a good ohmic contact, rendering the Chrome—Gold approach ineffective.

SUMMARY OF THE INVENTION

The present invention provides an improved method for forming a metal contact for a silicon sensor. First, platinum is deposited over a contact area. Then the platinum is sintered to form platinum silicide. Subsequently, titanium/tungsten (TiW) is deposited over the platinum silicide. Finally, gold is deposited over the TiW.

In a preferred embodiment, the contact area is formed by opening a hole through a layer of silicon nitride over a layer of silicon oxide. Preferably, a first hole is opened through the silicon nitride, and then a second hole, smaller than the first hole, is opened through the silicon oxide. This avoids retrograde undercutting of the silicon nitride.

For a further understanding of the nature and advantages of the invention, reference should be made to the following description taken in conjunction with the accompanying drawings.

BRIEF DESCRIPTION OF THE DRAWINGS

FIG. 4A is a cross-sectional view of the metalization on a sensor according to the invention.

FIG. 4B and FIG. 4C are blown-up cross-sections of the pad region and contact region of FIG. 4A.

FIG. 5 is a cross-sectional view of the two opening sizes through SiN and $SiO_2$.

DESCRIPTION OF THE PREFERRED EMBODIMENT

Figure 1:
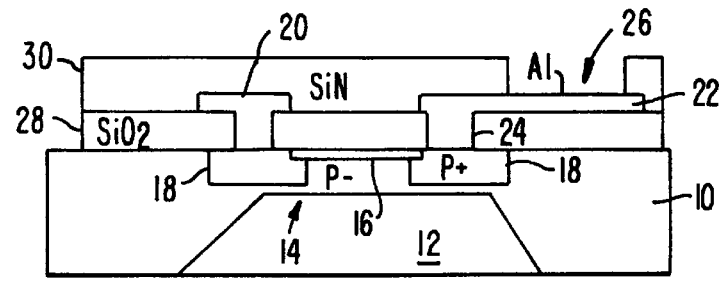
FIG. 1 is a cross-section of a prior art contact using aluminum.

FIG. 1 is a cross-sectional view of a prior art pressure sensor. A block of silicon 10 has a cavity 12 formed in its backside. The cavity defines a diaphragm 14 which will flex in response to a pressure differential. The flexing is detected by a number of piezo resistive resistors, such as a p-type resistor 16. Typically, four such resistors or four pairs of resistors are provided on the four sides of the diaphragm.

Connections to resistor 16 are provided by p+ diffusion areas 18, which form contact regions. These contact regions are connected to by aluminum metalization, as illustrated by aluminum areas 20 and 22. Aluminum area 22 has a contact portion 24 which interfaces with contact region 18, and a pad portion 26, which forms a bonding pad for attaching a wire bond when packaging the semiconductor chip into a package. The top surface of the silicon is protected by a silicon dioxide layer 28. The silicon dioxide and most of the metalization is protected by a layer of silicon nitride (SiN) 30, which forms a scratch surface for protecting the upper surface of the device.

Figure 2:
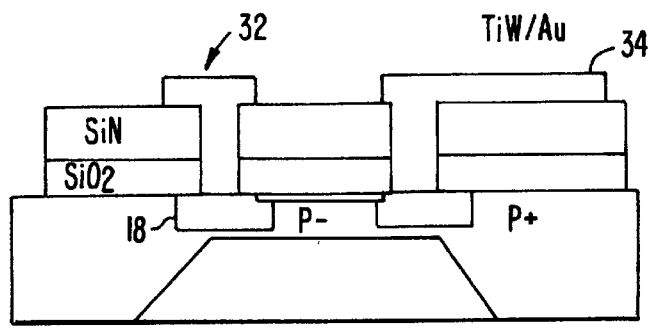
FIG. 2 is a cross-sectional view of a prior art contact using TiW/Au.

FIG. 2 is a cross-sectional view of an alternate prior art sensor. Here, instead of aluminum metalization, metalization areas 32 and 34 are formed of a composite metal of titanium, tungsten and aluminum (TiW/Au).

Figure 3:
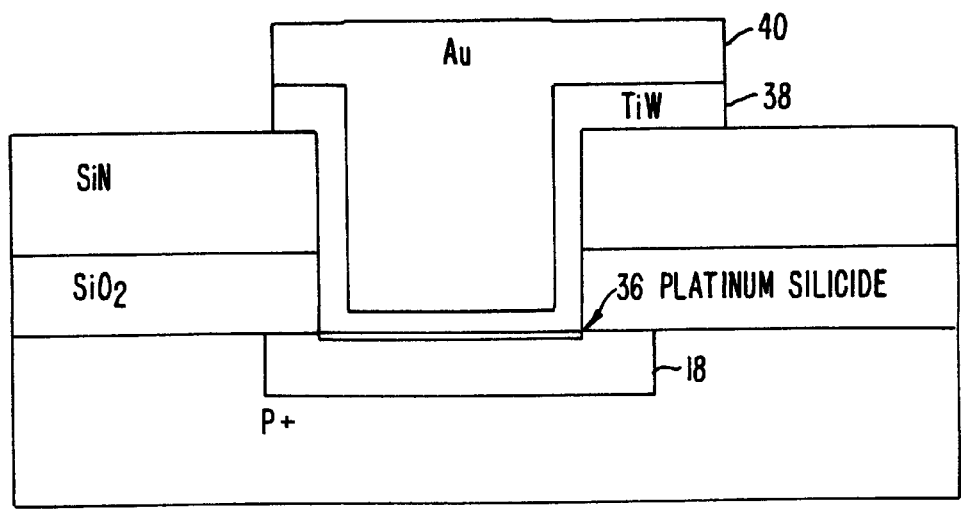
FIG. 3 is a cross-section of a sensor contact according to the invention.

A standard pressure sensor such as in FIG. 1 is normally fabricated in the following sequence as an example:

Epitaxial growth
   N+ Substrate Diffusion
   P+ Diffusion for "handles" for the piezoresistive sensing resistor
   P− Implant and drive-in for the sensing resistor
   Contact opening through oxide to contact the resistor
   Aluminum Metalization and patterning
   Nitride over-coat and Lithography to open up the metal bond pads
   Fab out of Wafer Foundry into the micromachining area
   Front/back alignment
   Electro-chemical KOH etch in fixtures through the back of the wafer until the diaphragm is reached FIG. 3 is a cross-sectional view of a contact according to the present invention. Over the contact area 18 is placed a platinum silicide layer 36 followed by a layer of titanium/tungsten (TiW) 38 and finally a layer of gold (Au) 40.

The new process for the structure of FIG. 3
   N+ Substrate Diffusion
   P+ Diffusion for "handles" for the piezoresistive sensing resistor
   P− Implant and drive-in for sensing resistor
   Nitride over-coat
   Contact opening through nitride and then through oxide to contact the resistor
   Platinum deposition followed by sintering to convert it to platinum silicide in the contact areas, followed by aqua-regia etch to remove platinum everywhere except in the silicided contact areas.
   Fab out of Wafer Foundry into the micromachining area TiW/Gold deposition and patterning (note that the TiW is actually two layers, an initial layer without $N_2$ and a second layer with $N_2$)

Front/back alignment

Electro-chemical KOH etch in fixtures through the back of the wafer until the diaphragm is reached The process uses the high-quality ohmic contact capability of platinum silicide with the TiW as a barrier to the Gold diffusion. The cross-section is detailed in FIGS. 4A–4C. This process sequence has not been previously produced for pressure sensors. Moreover, while the normal approach to the process dictates overcoating the aluminum with nitride, the nitride is deposited before the metal in this case to allow a conformal coating of nitride all over the wafer without the need to have a complex metalization system that is not easily processed. Nitride overcoating of the gold runs would usually require a good adhesion interface between the top of the metal and the nitride (such as chrome). Thus, one might end up with a composite metal, if the metal was capped, of TiW/Au/Cr. This requires more complex metal deposition systems than is required under the current approach. This, in turn, adds cost to the device.

There are three reasons for overcoating the metal. First is that aluminum is so easily attacked by acidic or basic gases or fluids. The second is that very fine-line metal traces are easily scratched. The third is that by overcoating, the metal traces are protected, except at the bond-pads, from surface leakage. The noble metal structure for pressure sensors overcomes the first two of three of these concerns. Optimum spacing of the metal traces on the top surface of the nitride can substantially reduce the third concern.

Note that the structure can be implemented with a nitride over-coat system, either immediately after metal is put down on oxide or after a first nitride layer is deposited followed by the metal. This will reduce the issue of surface leakage but increases the complexity of the metalization system. The present invention covers both the option shown in the attached figures and a nitride overcoating of the metal.

FIGS. 4A–4C illustrate the addition of a silicon nitride scratch mask 42 over the metalization of the invention.

FIG. 5 is a cross-section of one embodiment of an opening to contact region 18. First, a hole 44 is opened through a silicon nitride (SiN) layer 30. Next, a smaller hole 46 is opened through an $SiO_2$ layer 28. By using this two step process, retrograde undercutting of the oxide underneath the SiN is avoided.

The present invention thus provides a simple process with improved resistance to corrosive gases. In addition, good adhesion between layers is provided. In particular, TiW layer 38 of FIG. 3 is brought up to the top surface of the device, and extends over the SiN layer to isolate the gold from the silicon nitride (SiN), since gold and SiN do not easily form a good adhesion layer. In addition, this makes it more difficult for ionic contamination to reach the silicon dioxide layer.

As will be understood by those skilled in the art, the present invention may be embodied in other specific forms without departing from the essential characteristics thereof. Accordingly, the foregoing description is meant to be illustrative, but not limiting, of the scope of the invention which is set forth in the following claims.

What is claimed is:

1. A method for forming metal contacts for a silicon sensor, comprising:

forming a layer of silicon oxide;

forming a layer of silicon nitride over said silicon oxide;

opening a hole through said silicon nitride and said silicon oxide to form a contact area;

depositing platinum over said contact area;

sintering said platinum to form platinum silicide;

depositing TiW over said platinum silicide;

depositing gold over said TiW; and forming a metal bonding connection with said gold, without using a nitride overcoat.

2. The method of claim 1 further comprising, prior to depositing said platinum:

forming a layer of silicon oxide;

forming a layer of silicon nitride over said silicon oxide; and opening a hole through said silicon nitride and said silicon oxide to form a contact area.

3. The method of claim 1 wherein said opening a hole comprises:

opening a first hole through said silicon nitride; and opening a second hole, smaller than said first hole, through said silicon oxide.

4. The method of claim 1 further comprising:

forming an adhesion layer over said gold; and forming a second layer of silicon nitride over said adhesion layer.

5. The method of claim 1 wherein said layer of TiW is deposited along the walls of said hole and on a portion of the top of said layer of silicon nitride adjacent said hole.

6. The method of claim 1 wherein said contact is a piezo resistor contact in a pressure sensor.

7. A method for forming metal contacts for a silicon sensor, comprising:

forming a layer of silicon oxide;

forming a layer of silicon nitride over said silicon oxide;

opening a first hole through said silicon nitride;

opening a second hole, smaller than said first hole, through said silicon oxide;

depositing platinum over a contact area;

sintering said platinum to form platinum silicide;

depositing TiW over said platinum silicide;

depositing gold over said TiW; and forming a metal bonding connection with said gold, without using a nitride overcoat.

* * * * *

UNITED STATES PATENT AND TRADEMARK OFFICE
CERTIFICATE OF CORRECTION

PATENT NO. : 6,107,170
DATED : August 22, 2000
INVENTOR(S) : Sathe et al.

It is certified that error appears in the above-identified patent and that said Letters Patent is hereby corrected as shown below:

<u>Title page,</u>
Item [73], should read as follows:
Item [73] Assignee: Silicon Microstructures, Inc., Fremont, Calif Signed and Sealed this Twenty-seventh Day of November, 2001

Attest:

NICHOLAS P. GODICI
Attesting Officer
Acting Director of the United States Patent and Trademark Office